United States Patent
Gopalan

(10) Patent No.: US 9,653,401 B2
(45) Date of Patent: May 16, 2017

(54) METHOD FOR FORMING BURIED CONDUCTIVE LINE AND STRUCTURE OF BURIED CONDUCTIVE LINE

(75) Inventor: Vivek Gopalan, Boise, ID (US)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 110 days.

(21) Appl. No.: 13/443,899

(22) Filed: Apr. 11, 2012

(65) Prior Publication Data

US 2013/0270708 A1    Oct. 17, 2013

(51) Int. Cl.
| H01L 29/49 | (2006.01) |
| H01L 23/535 | (2006.01) |
| H01L 21/74 | (2006.01) |
| H01L 27/108 | (2006.01) |

(52) U.S. Cl.
CPC .......... *H01L 23/535* (2013.01); *H01L 21/743* (2013.01); *H01L 27/10891* (2013.01); *H01L 2924/0002* (2013.01)

(58) Field of Classification Search
USPC .......... 257/774, 775, 777, E23.011
See application file for complete search history.

(56) References Cited

U.S. PATENT DOCUMENTS

| 7,122,894 | B2 * | 10/2006 | Sugimoto et al. ............ 257/737 |
| 8,143,725 | B2 * | 3/2012 | Motojima ..................... 257/774 |
| 8,558,387 | B2 * | 10/2013 | Kato ............................. 257/774 |
| 2003/0011010 | A1 * | 1/2003 | Beer ..................... H01L 27/105 257/296 |
| 2009/0117738 | A1 * | 5/2009 | Sakaguchi ..................... 438/672 |
| 2011/0101539 | A1 | 5/2011 | Kato |
| 2012/0086128 | A1 * | 4/2012 | Ponoth ............. H01L 21/76897 257/774 |

FOREIGN PATENT DOCUMENTS

CN           1479376           3/2004

OTHER PUBLICATIONS

"Office Action of China Counterpart Application", issued on Sep. 29, 2014, p. 1-p. 6.
"Office Action of Taiwan Counterpart Application", issued on Jun. 18, 2014, p. 1-p. 4.

* cited by examiner

*Primary Examiner* — Michael Shingleton
(74) *Attorney, Agent, or Firm* — Jianq Chyun IP Office

(57) ABSTRACT

A method for forming a buried conductive line is described. A substrate having a trench therein and a contact area thereon is provided, wherein the trench has an end portion in the contact area and a conductive layer is filled in the trench. A mask layer is formed covering the conductive layer in the contact area. The conductive layer is etched back using the mask layer as a mask.

7 Claims, 1 Drawing Sheet

METHOD FOR FORMING BURIED CONDUCTIVE LINE AND STRUCTURE OF BURIED CONDUCTIVE LINE

BACKGROUND OF THE INVENTION

Field of Invention

This invention relates to integrated circuit (IC) fabrication, and particularly to a method for forming a buried conductive line, and a structure of a buried conductive line.

Description of Related Art

For purposes of increasing the channel length of transistors, fully utilizing the space of the substrate, increasing the distance between different levels of conductive lines and so forth, it is feasible to form buried conductive lines in the substrate.

For example, when the integration degree of DRAM increases beyond a certain level, the channel length of a traditional planar transistor is reduced to cause the short channel effects and so forth, and the shrinking of the device size also reduces the distance between word lines and bit lines to induce parasitic capacitance. By forming the word lines as buried lines in the substrate, the above issues are solved.

However, since the buried conductive layer is entirely buried deeply in the trench, the contact window later formed in the dielectric layer covering the buried conductive line has a large aspect ratio and is difficult to form. Moreover, since formation of the contact hole needs to etch through the dielectric layer filled in the trench over the buried conductive layer in the contact area, the epitaxy layer in the periphery is recessed.

SUMMARY OF THE INVENTION

Accordingly, this invention provides a method for forming a buried conductive line.

This invention also provides a structure of a buried conductive line that can be formed using the above method of this invention.

The method for forming a buried conductive line of this invention is described. A substrate having a trench therein and a contact area thereon is provided, wherein the trench has an end portion in the contact area and a conductive layer is filled in the trench. A mask layer is formed covering the conductive layer in the end portion of the trench, i.e., the conductive layer in the contact area. The conductive layer is etched back using the mask layer as a mask.

The structure of a buried conductive line of this invention includes a substrate and a conductive layer. The substrate has a trench therein and a contact area thereon, wherein the trench has an end portion in the contact area. The conductive layer is filled in the trench, wherein the top of the conductive layer in the end portion of the trench in the contact area is higher than that of the conductive layer not in the end portion of the trench in the contact area.

Since the top of the buried conductive line in the contact area is higher than that of the same in the non-contact area, the aspect ratio of the contact window later formed in the dielectric layer covering the buried line is smaller that that in the prior art.

Moreover, a nitride cap layer can be formed over the buried conductive line in the non-contact area, since the formation of the contact windows does not need to etch through the cap layer. Furthermore, the epitaxy layer recess in the periphery can be reduced greatly since formation of the contact window does not need to etch through a dielectric layer filled in the trench over the buried conductive line in the contact area.

In order to make the aforementioned and other objects, features and advantages of this invention comprehensible, a preferred embodiment accompanied with figures is described in detail below.

BRIEF DESCRIPTION OF THE DRAWINGS

FIG. 1B illustrates a top view of the structure shown in FIG. 1A, wherein FIG. 1A is an A-A' cross-sectional view of the structure.

DESCRIPTION OF EMBODIMENTS

This invention is further explained with the following embodiments referring to the accompanying drawings, which are not intended to limit the scope of this invention.

Figure 1A:
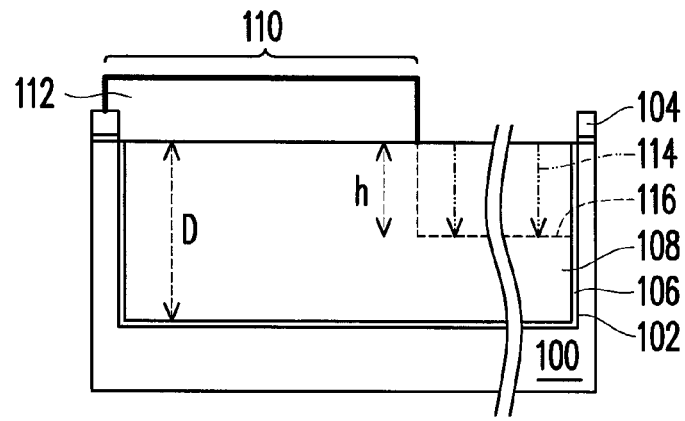
FIGS. 1A and 2 illustrate, in a cross-sectional view, a method for forming a buried conductive line according to an embodiment of this invention.
Figure 1B:
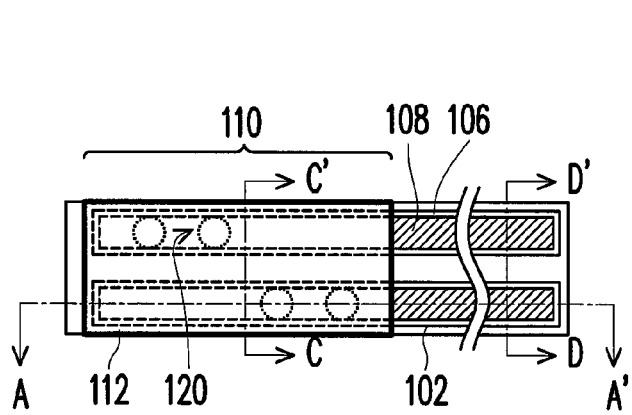
Figures 1C, 1D:
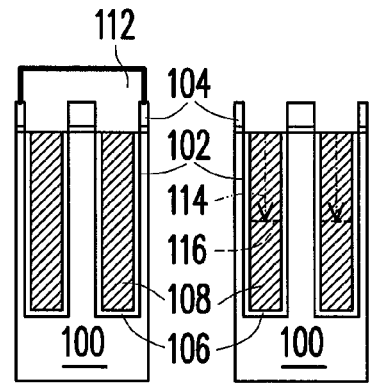
FIG. 1C/1D illustrates a C-C'/D-D' cross-sectional view of the structure shown in FIGS. 1A and 1B.
Figure 2:
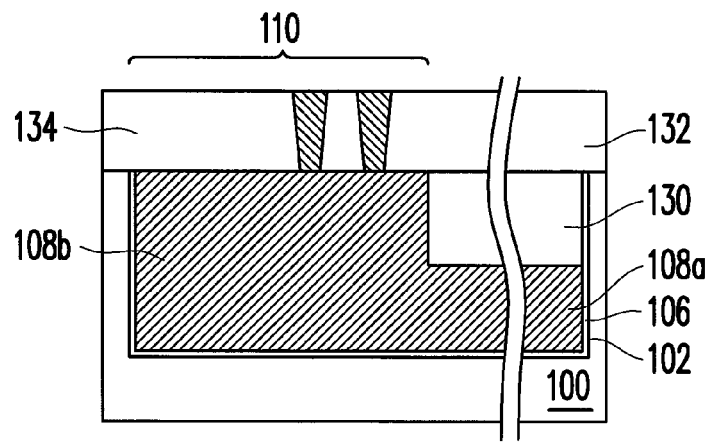

FIGS. 1A and 2 illustrate, in a cross-sectional view, a method for forming a buried conductive line according to an embodiment of this invention. FIG. 1B illustrates a top view of the structure shown in FIG. 1A, wherein FIG. 1A is an A-A' cross-sectional view of the structure. In addition, FIG. 1C/1D illustrates a C-C'/D-D' cross-sectional view of the structure shown in FIGS. 1A and 1B.

Referring to FIGS. 1A-1D, a substrate 100 having a plurality of trenches 102 therein is provided, wherein the trenches 102 can be defined by a mask layer 104 and is filled by a conductive layer 108. The substrate 100 may be a semiconductor substrate, such as an epitaxy-Si substrate. The depth D of the trenches 102 in the substrate 100 may range from 1300 angstroms to 1400 angstroms. The conductive layer 108 may be separated from the substrate 100 by an insulating layer 106 formed on the bottom and sidewalls of the trench 102, which may be formed through thermal oxidation. The conductive layer 108 may include doped poly-Si, or a metallic material. Examples of the metallic material include TiN and tungsten, etc. In addition, the substrate 100 has thereon a contact area 110 for the electrical connections of the buried conductive lines formed from the conductive layer 108 later, wherein each trench 102 has an end portion in the contact area 110.

Then, a mask layer 112 is formed covering the conductive layer 108 in the end portion of each trench 102, i.e., the conductive layer 108 in the contact area 110. The mask layer 112 may be a patterned positive photoresist layer that is defined lithographically. Anisotropic etching 114 is performed using the mask layer 112 as a mask to etch back the exposed conductive layer 108 outside of the contact area 110, so that the conductive layer 108 outside of the contact area 110 has a profile 116. Thus, buried conductive lines 108 each being higher in the contact area 110 is obtained. The buried conductive lines 108 may serve as, but not limited to, the word lines of a DRAM array. The depth h of the etching-back may range from 600 angstroms to 650 angstroms. The positions of the contact windows formed later on the conductive layer 108 in the contact area 110 are indicated by the dot-circles 120.

Referring to FIG. 2, after the anisotropic etching 114 is performed and the mask layer 104 is removed, a cap layer 130 can be filled in each trench 102 over the conductive layer 108a outside of the contact area 110. A dielectric layer 132 is formed covering the substrate 100, the buried conductive line 108a+b and the cap layer 130, and then contact windows 134 are formed in the dielectric layer 132. Each buried conductive line 108a+b may have thereon two or more contact windows 134 over the portion 108b thereof in the contact area 110, so as to reduce the electrical resistance.

Since the top of the portion 108b of each buried conductive line 108a+b in the contact area 110 is higher than that of the portion 108a of the same not in the contact area 110, the aspect ratio of the contact windows 134 later formed in the dielectric layer 132 covering the buried conductive line 108a+b is smaller that that in the prior art.

Moreover, the cap layer 130 may include a hard material such as SiN, since the formation of the contact windows 134 does not need to etch through the cap layer 130. Furthermore, the epitaxy layer recess in the periphery can be reduced significantly, since the formation of the contact windows 134 does not need to etch through a dielectric layer filled in the trench 102 over the portion 108b of the buried conductive line 108a+b in the contact area 110.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A structure of a buried conductive line, comprising:
a semiconductor substrate, having a trench therein and a contact area thereon, wherein the trench has an end portion in the contact area;
a conductive layer filled in the trench, wherein a top of the conductive layer in the end portion of the trench is higher than a top of the conductive layer not in the end portion of the trench;
a cap layer located in the trench, wherein the cap layer only covers the top of the conductive layer not in the end portion of the trench,
wherein a bottom of the conductive layer located in the contact area and not located in the contact area has a substantially constant bottom level,
wherein the conductive layer located in the contact area contacts the conductive layer not located in the contact area;
a dielectric layer covering the semiconductor substrate and the conductive layer;
at least one contact window in the dielectric layer and on the conductive layer in the end portion of the trench, wherein the at least one contact window is located in the contact area; and
an insulating layer in a bottom of the trench separating the conductive layer from the semiconductor substrate, and in a side of the trench separating the conductive layer from the semiconductor substrate.

2. The structure of claim 1, further comprising a cap layer over the conductive layer not in the end portion of the trench.

3. The structure of claim 1, wherein the buried conductive line serves as a word line.

4. A structure of a buried conductive line, comprising:
a substrate, having a trench therein and a contact area thereon, wherein the trench has an end portion in the contact area and has a substantially constant top level in and outside of the contact area;
a conductive layer filled in the trench, wherein a top of the conductive layer in the end portion of the trench is higher than a top of the conductive layer not in the end portion of the trench, and the top of the conductive layer not in the end portion of the trench is lower than the top level of the trench;
a cap layer located in the trench, wherein the cap layer only covers the top of the conductive layer not in the end portion of the trench,
wherein a bottom of the conductive layer located in the contact area and not located in the contact area has a substantially constant bottom level,
wherein the conductive layer located in the contact area contacts the conductive layer not located in the contact area;
a dielectric layer covering the substrate and the conductive layer;
at least one contact window in the dielectric layer and on the conductive layer in the end portion of the trench, wherein the at least one contact window is located in the contact area; and
an insulating layer in a bottom of the trench separating the conductive layer from the substrate, and in a side of the trench separating the conductive layer from the substrate.

5. The structure of claim 4, further comprising a cap layer over the conductive layer not in the end portion of the trench.

6. The structure of claim 4, wherein the buried conductive line serves as a word line.

7. A structure of a buried conductive line, comprising:
a semiconductor substrate, having a pair of parallel trenches therein and a contact area thereon, wherein each of the pair of parallel trenches has an end portion in the contact area;
a pair of conductive layers respectively filled in the pair of parallel trenches, wherein a top of each of the conductive layers in the end portion of each of the pair of parallel trenches is higher than a top of each of the conductive layers not in the end portion of each of the pair of parallel trenches;
a pair of cap layers respectively located in the pair of parallel trenches, wherein the cap layers only cover the top of the respective conductive layer not in the end portion of the trench,
a dielectric layer covering the semiconductor substrate and the pair of conductive layers;
at least two contact windows in the dielectric layer and respectively on each of the conductive layers in the end portion of each of the pair of parallel trenches, wherein the at least two contact windows are located in the contact area; and
a pair of insulating layers respectively in a bottom of each of the pair of parallel trenches, separating the pair of conductive layers from the semiconductor substrate, and in a side of each of the pair of parallel trenches, separating the pair of conductive layers from the semiconductor substrate.

* * * * *